United States Patent
Ryoo et al.

(10) Patent No.: US 7,313,244 B2
(45) Date of Patent: Dec. 25, 2007

(54) CIRCUIT AND METHOD FOR ELIMINATING POP NOISE IN DIGITAL AUDIO AMPLIFIER USING DUAL POWER SUPPLY

(75) Inventors: Tae Ha Ryoo, Daejeon (KR); Byung Tak Jang, Daejeon (KR); Ji-yeoul Ryoo, Suwon (KR)

(73) Assignee: DMB Technology Co., Ltd., Daejeon (KR)

( * ) Notice: Subject to any disclaimer, the term of this patent is extended or adjusted under 35 U.S.C. 154(b) by 42 days.

(21) Appl. No.: 10/527,677

(22) PCT Filed: Sep. 9, 2003

(86) PCT No.: PCT/KR03/01875

§ 371 (c)(1),
(2), (4) Date: Oct. 14, 2005

(87) PCT Pub. No.: WO2004/025830

PCT Pub. Date: Mar. 25, 2004

(65) Prior Publication Data

US 2006/0126864 A1    Jun. 15, 2006

(30) Foreign Application Priority Data

Sep. 11, 2002   (KR) .................. 10-2002-0054939

(51) Int. Cl.
*H04B 15/00* (2006.01)

(52) U.S. Cl. ..................... 381/94.5
(58) Field of Classification Search .............. 381/94.1, 381/94.5, 81, 28, 120, 123, 106; 330/351, 330/254, 51, 270–271, 10, 207, 251; 275/335; 320/128

See application file for complete search history.

(56) References Cited

U.S. PATENT DOCUMENTS

| | | | | |
|---|---|---|---|---|
| 5,162,752 | A * | 11/1992 | Padi | 330/263 |
| 5,883,495 | A * | 3/1999 | Smith et al. | 320/128 |
| 6,169,449 | B1 * | 1/2001 | Hasegawa | 330/51 |
| 6,597,240 | B1 * | 7/2003 | Walburger et al. | 330/10 |

\* cited by examiner

*Primary Examiner*—Vivian Chin
*Assistant Examiner*—Lun-See Lao
(74) *Attorney, Agent, or Firm*—Jones Day

(57) ABSTRACT

Provided are a circuit for and a method of eliminating pop noise in a digital audio amplifier using dual power supply, which are simple, drop in price, and can be readily implemented in a semiconductor chip. According to an existing technique, pop noise is eliminated using a relay. However, in the present circuit and method, pop noise is eliminated using the small number of discrete electronic devices. The circuit for eliminating pop noise controls a voltage at a gate of a power switch, i.e., a power MOS transistor, when power supply voltages are applied and the application of power supply voltages is stopped.

8 Claims, 5 Drawing Sheets

CIRCUIT AND METHOD FOR ELIMINATING POP NOISE IN DIGITAL AUDIO AMPLIFIER USING DUAL POWER SUPPLY

TECHNICAL FIELD

The present invention relates to a digital audio amplifier, and more particularly, to a circuit for and a method of eliminating pop noise in a digital audio amplifier using dual power supply.

BACKGROUND ART

As shown in FIG. 1, according to related art, a relay 14 is used to eliminate pop noise in a digital audio amplifier 10. In other words, the relay 14 is disposed between the digital audio amplifier 10 and a speaker 12, and a relay controller 16 senses a line voltage and operates the relay 14 when the digital audio amplifier 10 can operate normally. Then the relay 14 connects the digital audio amplifier 10 to the speaker 12, thus preventing the occurrence of pop noise in the digital audio amplifier 10.

The digital audio amplifier 10 includes a power PMOS transistor PM1, a power NMOS transistor NM1, a gate controller 101, and capacitors C1 and C2. An output-terminal filter, including an inductor L1 and a capacitor C3, is connected to an output terminal O.

However, the relay 14 is an electric mechanical device and bulk and expensive when compared with a general electronic device. Moreover, the relay 14 cannot be used independently and so requires the separate relay controller 16.

DISCLOSURE OF THE INVENTION

The present invention provides a circuit for eliminating pop noise in a digital audio amplifier using dual power supply, which is simply structured, drops in price, and is readily implemented in a semiconductor chip.

The present invention also provides a method of eliminating pop noise in a digital audio amplifier using dual power supply, which is simple, drops in price, and is readily implemented in a semiconductor chip.

According to one aspect of the present invention, there is provided a circuit for eliminating pop noise including a power PMOS transistor having a source to which a first power supply voltage is applied and a drain connected to an output terminal, a power NMOS transistor having a drain connected to the output terminal and a source to which a second power supply voltage is applied, a gate controller that controls a gate of the power PMOS transistor and a gate of the power NMOS transistor, and an output-terminal filter having an inductor and a capacitor.

The circuit comprises a first switch, a second switch, and a switch controller. The first switch is connected between the first power supply voltage and the gate of the power PMOS transistor. The second switch is connected between the second power supply voltage and the gate of the power NMOS transistor. The switch controller senses the first power supply voltage and the second power supply voltage and generates a first control signal for controlling the first switch and a second control signal for controlling the second switch. The switch controller turns on the first switch and the second switch until the first power supply voltage and the second power supply voltage reach respective threshold voltages and turns off the first switch and the second switch after the first power supply voltage and the second power supply voltage reach respective threshold voltages.

According to another aspect of the present invention, there is provided a method of eliminating pop noise in a digital audio amplifier including a power PMOS transistor connected between a first power supply voltage and an output terminal, a power NMOS transistor connected between the output terminal and a second power supply voltage, a gate controller that controls a gate of the power PMOS transistor and a gate of the power NMOS transistor, and an output-terminal filter having an inductor and a capacitor.

The method comprises sensing the first power supply voltage and the second power supply voltage, as a result of the sensing, when the first power supply voltage does not reach a first threshold voltage, applying the first power supply voltage to the gate of the power PMOS transistor, and when the second power supply voltage does not reach a second threshold voltage, applying the second power supply voltage to the gate of the power NMOS transistor, and as a result of the sensing, after the first power supply voltage reaches the first threshold voltage, not applying the first power supply voltage to the gate of the power PMOS transistor, and after the second power supply voltage does not reach the second threshold voltage, not applying the second power supply voltage to the gate of the power NMOS transistor.

The circuit for and method of eliminating pop noise according to the present invention directly control a gate of a power MOS transistor when power supply voltages are applied and the application of the power supply voltages is stopped, thereby suppressing generation of pop noise. Also, the present invention can be readily implemented using the small number of discrete electronic devices. Accordingly, drop in volume and price can be realized. Moreover, the circuit for eliminating pop noise can be easily integrated into a semiconductor chip, thus improving effects of the present invention much more.

BRIEF DESCRIPTION OF THE DRAWINGS

The above and other features and advantages of the present invention will become more apparent by describing in detail exemplary embodiments thereof with reference to the attached drawings in which.

BEST MODE FOR CARRYING OUT THE INVENTION

Figure 1:
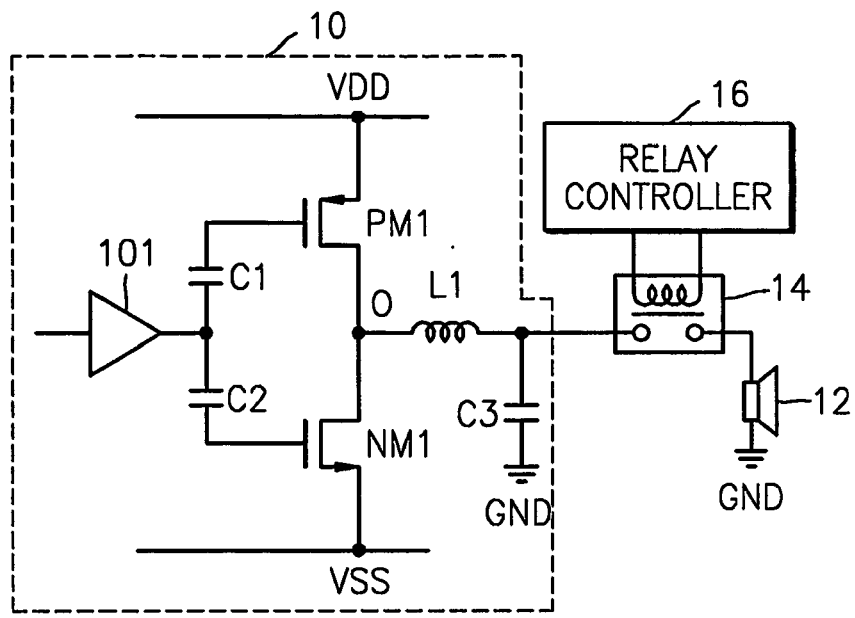
FIG. 1 is a block diagram of a conventional apparatus for eliminating pop noise in a digital audio amplifier.

The present invention will now be described more fully with reference to the accompanying drawings, in which preferred embodiments of the invention are shown. In the drawings, like reference numerals are used to refer to like elements throughout.

Figure 2:
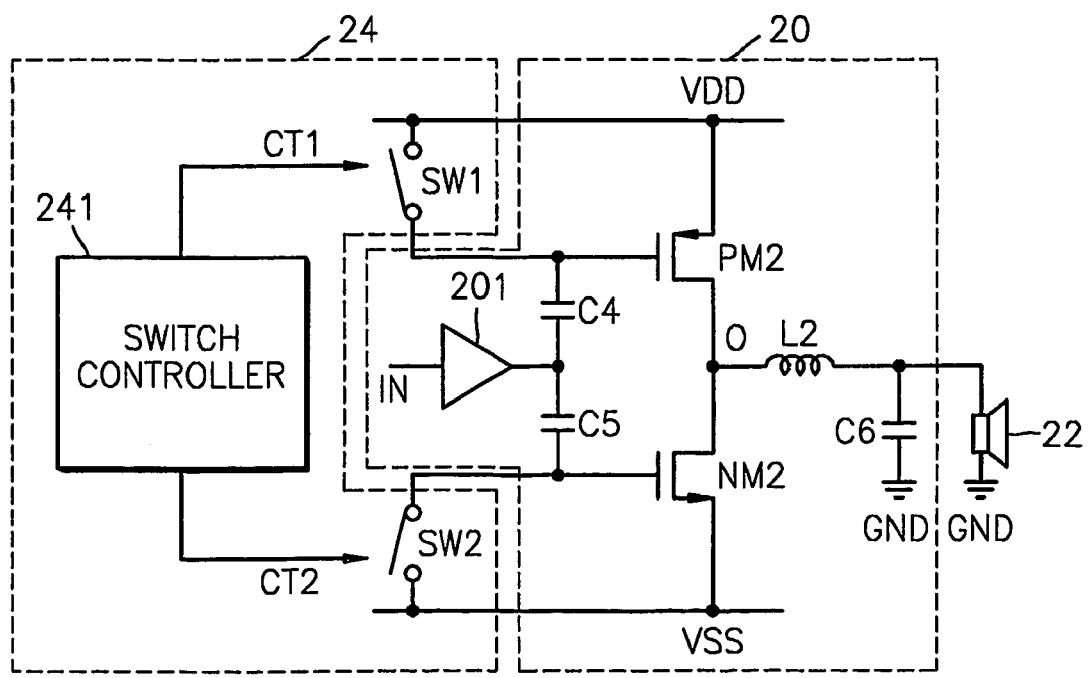
FIG. 2 is a block diagram of a digital audio amplifier including a circuit for eliminating pop noise, according to the present invention.

FIG. 2 is a block diagram of a digital audio amplifier including a circuit for eliminating pop noise, according to the present invention.

Referring to FIG. 2, a circuit 24 for eliminating pop noise according to the present invention includes a first switch SW1, a second switch SW2, and a switch controller 241. The circuit 24 is connected to a previous terminal of a digital audio amplifier 20.

To be more specific, the digital audio amplifier 20 includes a power PMOS transistor PM2, a power NMOS transistor NM2, capacitors C4 and C5, a gate controller 201, and a filter including an inductor L2 and a capacitor C6. The digital audio amplifier 20 is connected to a speaker 22.

A first power supply voltage VDD, i.e., a positive power supply voltage, is applied to a source of the power PMOS transistor PM2. A drain of the power PMOS transistor PM2 is connected to an output terminal O. A drain of the power NMOS transistor NM2 is connected to the output terminal O, and a second power supply voltage VSS, i.e., a negative power supply voltage, is connected to a source of the power NMOS transistor NM2. The gate controller 201 controls a gate of the power PMOS transistor PM2 and a gate of the power NMOS transistor NM2 in response to a signal IN input through an input terminal. The input signal IN is output from a predetermined control circuit (not shown).

The capacitor C4 is connected between the output terminal of the gate controller 201 and the gate of the power PMOS transistor PM2. The capacitor C5 is connected between the output terminal of the gate controller 201 and the gate of the power NMOS transistor NM2. The capacitors C4 and C5 are used to deliver an output signal of the gate controller 201 to the gate of the power PMOS transistor PM2 and the gate of the power NMOS transistor NM2 while maintaining a power supply voltage difference among the gate controller 201 and the two power transistors, i.e., the power PMOS transistor PM2 and the power NMOS transistor NM2.

As described above, the circuit 24 for eliminating pop noise includes the first switch SW1, the second switch SW2, and the switch controller 241 and operates according to a method of eliminating pop noise according to the present invention. The first switch SW1 is connected between the first power supply voltage VDD and the gate of the power PMOS transistor PM2. The second switch SW2 is connected between the second power supply voltage VSS and the gate of the power NMOS transistor NM2.

The switch controller 241 senses the first power supply voltage VDD and the second power supply voltage VSS and generates a first control signal CT1 for controlling the first switch SW1 and a second control signal CT2 for controlling the second switch SW2. In particular, the switch controller 241 turns on the first switch SW1 and the second switch SW2 before the first power supply voltage VDD and the second power supply voltage VSS reach respective threshold voltage levels. After the first power supply voltage VDD and the second power supply voltage VSS reach respective threshold voltage levels, the switch controller 241 turns off the first switch SW1 and the second switch SW2.

More specifically, if a power supply voltage, i.e., the first power supply voltage VDD and the second power supply voltage VSS are initially applied, the gate controller 201 cannot operate normally until they reach predetermined levels. At this time, it is difficult to know the levels of gate voltages of power switches, i.e., the power PMOS transistor PM2 and the power NMOS transistor NM2. This causes pop noise when the first power supply voltage VDD and the second power supply voltage VSS are applied and their application is stopped. Thus, in order to eliminate pop noise, the power PMOS transistor PM2 and the power NMOS transistor NM2 must operate only after the first power supply voltage VDD and the second power supply voltage VSS are sensed and the digital audio amplifier 20 can operate normally.

For such operations, in the present invention, the switch controller 241 senses the first power supply voltage VDD and the second power supply voltage VSS and turns on the first switch SW1 and the second switch SW2 when the first power supply voltage VDD and the second power supply voltage VSS are not sufficient, i.e., do not reach respective threshold voltage levels, thereby turning off the power PMOS transistor PM2 and the power NMOS transistor NM2 and preventing generation of pop noise. Next, after the first power supply voltage VDD and the second power supply voltage VSS reach respective threshold voltage levels, the switch controller 241 turns off the first switch SW1 and the second switch SW2, thereby operating the power PMOS transistor PM2 and the power NMOS transistor NM2. When the application of the first power supply voltage VDD and the second power supply voltage VSS is stopped, the switch controller 241 turns on the first switch SW1 and the second switch SW2 if the first power supply voltage VDD and the second power supply voltage VSS are lower than respective threshold voltage levels. Thus, the power PMOS transistor PM2 and the power NMOS transistor NM2 are turned off, thereby preventing generation of pop noise.

Figure 3:
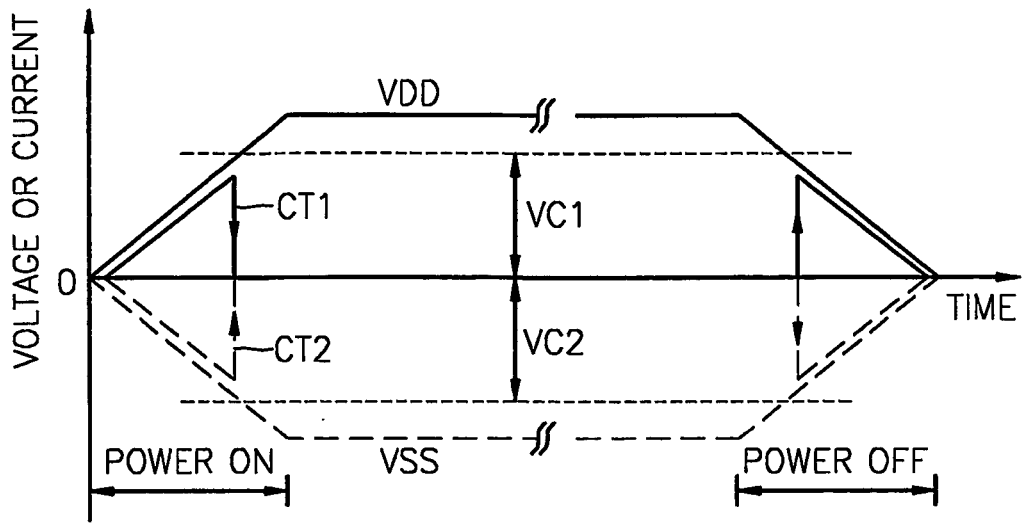
FIG. 3 illustrates waveforms of main signals of the circuit of FIG. 2 over time.

FIG. 3 illustrates waveforms of main signals of the circuit of FIG. 2 over time.

Referring to FIG. 3, when the first power supply voltage VDD and the second power supply voltage VSS are applied, the positive power supply voltage, i.e., the first power supply voltage VDD increases over time while the negative power supply voltage, i.e., the second power supply voltage VSS decreases over time. As a result, the first power supply voltage VDD and the second power supply voltage VSS reach respective target voltage levels and stably maintain voltage levels. At this time, the first control signal CT1 for controlling the first switch SW1 and the second control signal CT2 for controlling the second switch SW2 increase or decrease according to the first power supply voltage VDD and the second power supply voltage VSS, respectively. After the first power supply voltage VDD and the second power supply voltage VSS reach predetermined threshold voltage levels VC1 and VC2, respectively, the first control signal CT1 and the second control signal CT2 are logic "0s". On the other hands, when the application of the first power supply voltage VDD and the second power supply voltage VSS is stopped, the first control signal CT1 and the second control signal CT2 are generated from the moment when the first power supply voltage VDD and the second power supply voltage VSS are less than respective threshold voltage levels VC1 and VC2.

The first switch SW1 and the second switch SW2 may include current driving devices such as a bipolar transistor or may include voltage driving devices such as a MOS transistor. If the first switch SW1 and the second switch SW2 include bipolar transistors, the first control signal CT1 and the second control signal CT2 correspond to currents at bases of the bipolar transistors. If the first switch SW1 and the second switch SW2 include MOS transistors, the first control signal CT1 and the second control signal CT2 correspond to voltages between sources and gates of the MOS transistors. The first switch SW1 and the second switch SW2 are turned on when the first control signal CT1 and the second control signal CT2 are more than respective thresholds. When the first control signal CT1 and the second control signal CT2 are less than respective thresholds, the first switch SW1 and the second switch SW2 are turned off.

Figure 4:
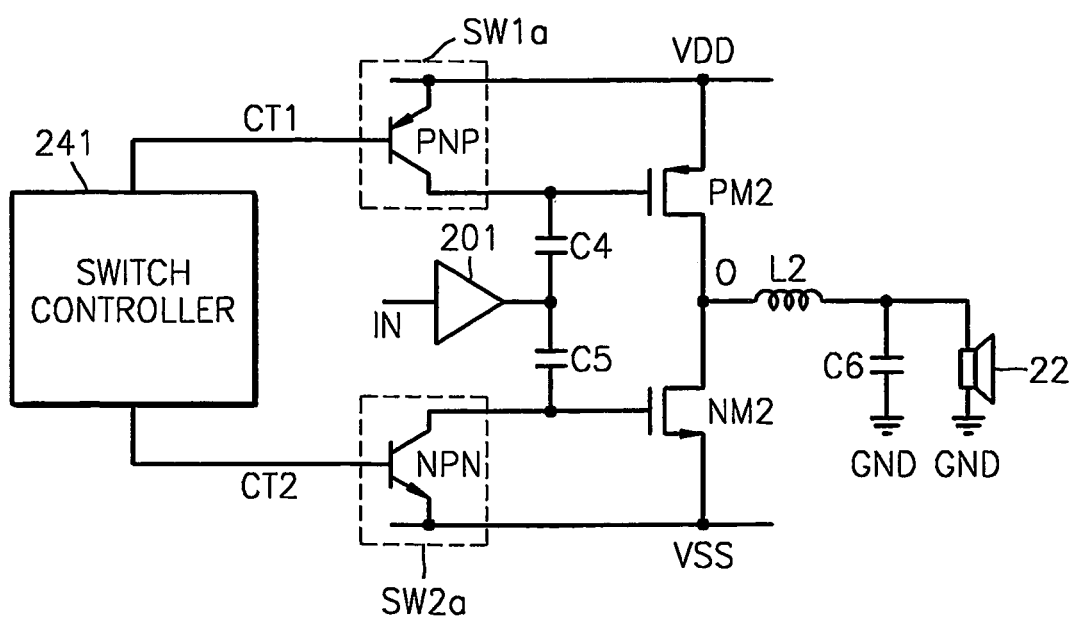
FIG. 4 is a block diagram of a digital audio amplifier including a circuit for eliminating pop noise where switches of FIG. 2 are implemented as electronic devices, according to a first embodiment of the present invention.

FIG. 4 is a block diagram of a digital audio amplifier including a circuit for eliminating pop noise where switches of FIG. 2 are implemented as electronic devices, according to a first embodiment of the present invention.

Referring to FIG. 4, a first switch SW1a includes one PNP-type bipolar transistor PNP and a second switch SW2a includes one NPN-type bipolar transistor NPN.

The first power supply voltage VDD is applied to an emitter of the PNP-type bipolar transistor PNP. The first control signal CT1 is applied to a base of the PNP-type bipolar transistor PNP. The gate of the power PMOS transistor PM2 is connected to a collector of the PNP-type bipolar transistor PNP. The second power supply voltage VSS is applied to an emitter of the NPN-type bipolar transistor NPN. The second control signal CT2 is applied to a base of the NPN-type bipolar transistor NPN. The gate of the power NMOS transistor NM2 is connected to a collector of the NPN-type bipolar transistor NPN.

Here, a current flowing from the base of the PNP-type bipolar transistor PNP corresponds to the first control signal CT1 and a current flowing from the base of the NPN-type bipolar transistor corresponds to the second control signal CT2. When the amplitudes of currents are more than respective thresholds of the first switch SW1 and the second switch SW2, the first switch SW1 and the second switch SW2 are turned on. Thus, a gate potential of the power PMOS transistor PM2 increases to the first power supply voltage VDD and a gate potential of the power NMOS transistor NM2 decreases to the second power supply voltage VSS. At this time, two power switches, i.e., the power PMOS transistor PM2 and the power NMOS transistor NM2, enter off states.

Meanwhile, the first switch SW1a may include a PMOS transistor instead of the PNP-type bipolar transistor PNP and the second switch SW2a may include an NMOS transistor instead of the NPN-type bipolar transistor NPN. In this case, the first power supply voltage VDD is applied to a source of the PMOS transistor, the first control signal CT1 is applied to a gate of the PMOS transistor, and the gate of the power PMOS transistor PM2 is connected to a drain of the PMOS transistor. The second power supply voltage VSS is applied to a source of the NMOS transistor, the second control signal CT2 is applied to a gate of the NMOS transistor, and the gate of the power NMOS transistor NM2 is connected to a drain of the NMOS transistor.

Figure 5:
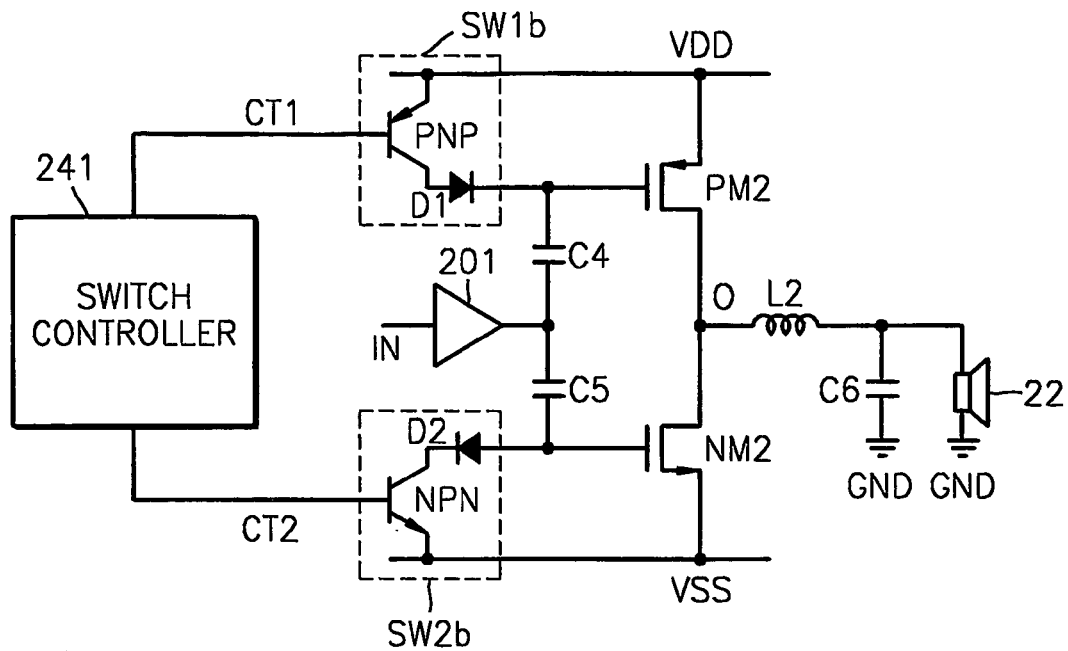
FIG. 5 is a block diagram of a digital audio amplifier including a circuit for eliminating pop noise where the switches of FIG. 2 are implemented as electronic devices, according to a second embodiment of the present invention.

FIG. 5 is a block diagram of a digital audio amplifier including a circuit for eliminating pop noise where the switches of FIG. 2 are implemented as electronic devices, according to a second embodiment of the present invention.

Referring to FIG. 5, a first switch SW1b includes one PNP-type bipolar transistor PNP and one diode D1, and a second switch SW2b includes one NPN-type bipolar transistor NPN and one diode D2.

The first power supply voltage VDD is applied to an emitter of the PNP-type bipolar transistor PNP. The first control signal CT1 is applied to a base of the PNP-type bipolar transistor PNP. One terminal of the diode D1 is connected to a collector of the PNP-type bipolar transistor PNP. The other terminal of the diode D1 is connected to the gate of the power PMOS transistor PM2. The second power supply voltage VSS is applied to an emitter of the NPN-type bipolar transistor NPN. The second control signal CT2 is applied to a base of the NPN-type bipolar transistor NPN. One terminal of the diode D2 is connected a collector of the NPN-type bipolar transistor NPN. The other terminal of the diode D2 is connected to the gate of the power NMOS transistor NM2.

Here, the diode D1 is further included for the purpose of preventing backflow when the gate potential of the power PMOS transistor PM2 is higher than the first power supply voltage VDD. Similarly, the diode D2 is further included for the purpose of preventing backflow when the gate potential of the power NMOS transistor NM2 is lower than the second power supply voltage VSS.

The PNP-type bipolar transistor PNP of the first switch SW1b may be replaced by a PMOS transistor and the NPN-type bipolar transistor NPN of the second switch SW2b may be replaced by an NMOS transistor. In this case, the first power supply voltage VDD is applied to a source of the PMOS transistor, the first control signal CT1 is applied to a gate of the PMOS transistor, and one terminal of the diode D1 is connected to a drain of the PMOS transistor. The second power supply voltage VSS is applied to a source of the NMOS transistor, the second control signal CT2 is applied to a gate of the NMOS transistor, and one terminal of the diode D2 is connected to a drain of the NMOS transistor.

Figure 6:
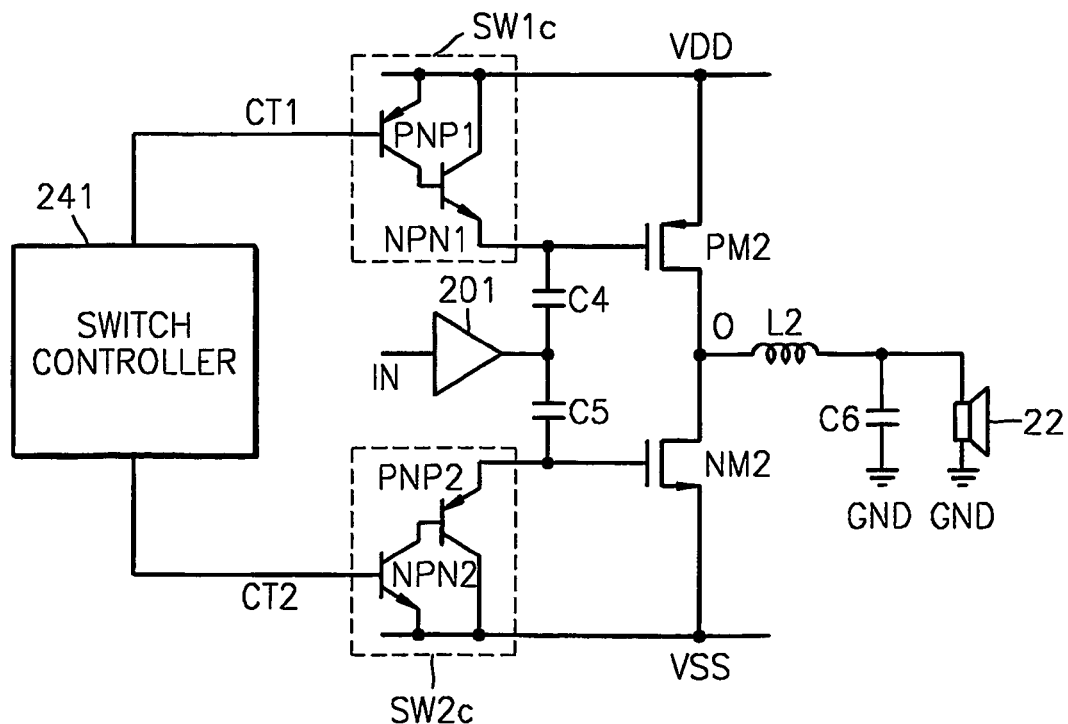
FIG. 6 is a block diagram of a digital audio amplifier including a circuit for eliminating pop noise where the switches of FIG. 2 are implemented as electronic devices, according to a third embodiment of the present invention.

FIG. 6 is a block diagram of a digital audio amplifier including a circuit for eliminating pop noise where the switches of FIG. 2 are implemented as electronic devices, according to a third embodiment of the present invention.

Referring to FIG. 6, a first switch SW1c includes one PNP-type bipolar transistor PNP1 and one NPN-type bipolar transistor NPN1, and a second switch SW2c includes one PNP bipolar transistor PNP2 and one NPN-type bipolar transistor NPN2.

The first power supply voltage VDD is applied to an emitter of the PNP-type bipolar transistor PNP1. The first control signal CT1 is applied to a base of the PNP-type bipolar transistor PNP1. The gate of the power PMOS transistor PM2 is connected to an emitter of the NPN-type bipolar transistor NPN1. A collector of the PNP-type bipolar transistor PNP1 is connected to a base of the NPN-type bipolar transistor NPN1. The first power supply voltage VDD is applied to a collector of the NPN-type bipolar transistor NPN1.

The second power supply voltage VSS is applied to an emitter of the NPN-type bipolar transistor NPN2. The second control signal CT2 is applied to a base of the NPN-type bipolar transistor NPN2. The gate of the power NMOS transistor NM2 is connected to an emitter of the PNP-type bipolar transistor PNP2. A collector of the NPN-type bipolar transistor NPN2 is connected to a base of the PNP-type bipolar transistor PNP2. The second power supply voltage VSS is applied to a collector of the NPN-type bipolar transistor NPN2.

Figure 7:
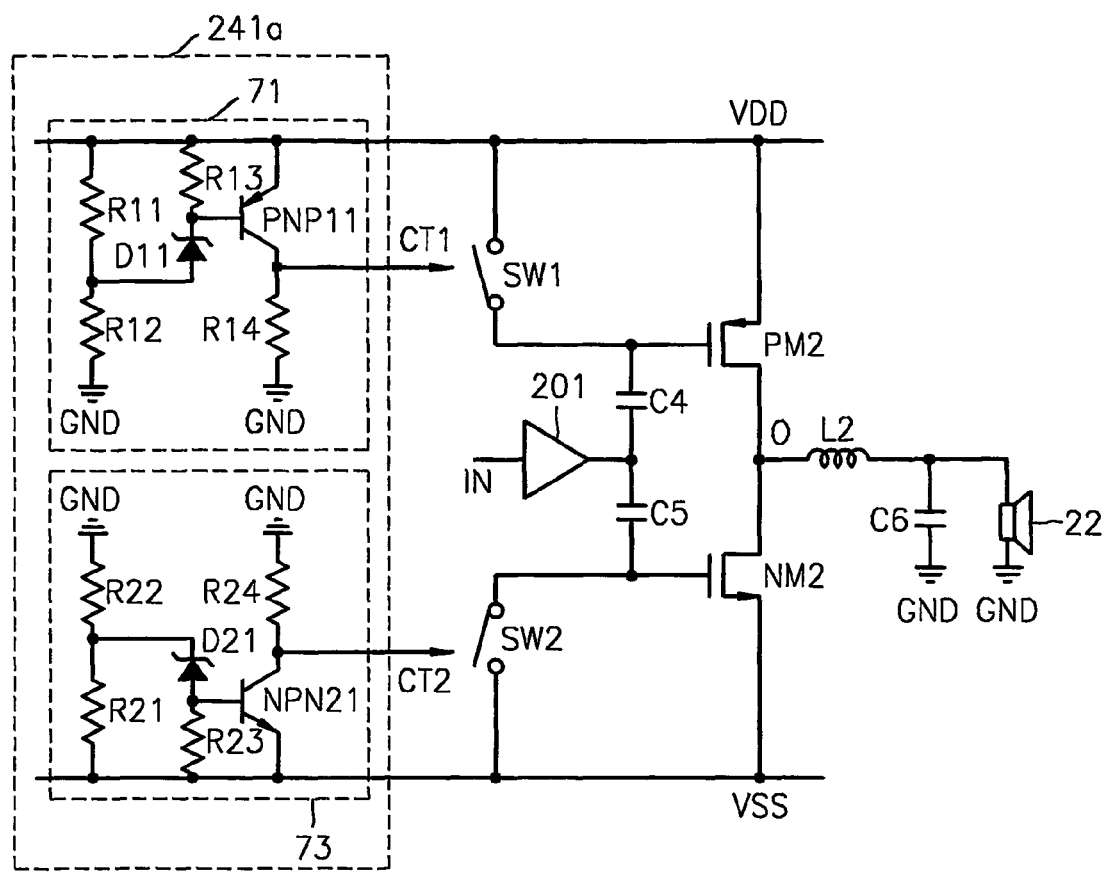
FIG. 7 illustrates a switch controller of FIG. 2 according to a first embodiment of the present invention.

FIG. 7 illustrates a first embodiment of the switch controller 241 of FIG. 2.

Referring to FIG. 7, a switch controller 241a includes a first control portion 71 that senses the first power supply voltage VDD and generates the first control signal CT1 and a second control portion 73 that senses the second power supply voltage VSS and generates the second control signal CT2.

The first control portion 71 includes first through fourth resistors R11-R14, a zener diode D11, and a PNP-type bipolar transistor PNP11.

One terminal of the first resistor R11 is connected to the first power supply voltage VDD. One terminal of the second resistor R12 is connected to the other terminal of the first resistor R11. The other terminal of the second resistor R12 is connected to a ground voltage GND. One terminal of the third resistor R13 is connected to the first power supply voltage VDD. On terminal of the zener diode D11 is connected to the other terminal of the first resistor R11. The other terminal of the diode D11 is connected to the other terminal of the third resistor R13. The first power supply voltage VDD is applied to an emitter of the PNP-type bipolar transistor PNP11. The other terminal of the third resistor R13 is connected to a base of the PNP-type bipolar transistor PNP11. The first control signal CT1 is output from a collector of the PNP-type bipolar transistor PNP11. One terminal of the fourth resistor R14 is connected to a collector of the PNP-type bipolar transistor PNP11. The other terminal of the fourth resistor R14 is connected to the ground voltage GND.

The second control portion 73 includes first through third resistors R21-R24, a diode D21, and an NPN-type bipolar transistor NPN21.

One terminal of the first resistor R21 is connected to the second power supply voltage VSS. One terminal of the second resistor R22 is connected to the other terminal of the first resistor R21 and the other terminal of the second resistor R22 is connected to the ground voltage GND. One terminal of the third resistor R23 is connected to the second power supply voltage VSS. One terminal of the diode D21 is connected to the other terminal of the first resistor R21 and the other terminal of the diode D21 is connected to the other terminal of the third resistor R23. The second power supply voltage VSS is applied to an emitter of the NPN-type bipolar transistor NPN21. The other terminal of the third resistor R23 is connected to a base of the NPN-type bipolar transistor NPN21. The second control signal CT2 is output from a collector of the NPN-type bipolar transistor NPN21. One terminal of the fourth resistor R24 is connected to the collector of the NPN-type bipolar transistor NPN21 and the other terminal of the fourth resistor R24 is connected to the ground voltage GND.

The switch controller 241a shown in FIG. 7 according to the first embodiment is based on a bipolar transistor, but the configuration of the switch controller 241 a can be changed to various forms.

For more explanation of the operation of the switch controller 241a, when the first power supply voltage VDD and the second power supply voltage VSS are less than respective threshold voltages levels VC1 and VC2 shown in FIG. 3, currents do not flow through the PNP-type bipolar transistor PNP11 and the NPN-type bipolar transistor NPN21. As a result, the PNP-type bipolar transistor PNP11 and the NPN-type bipolar transistor NPN21 are in off states. At this time, the first control signal CT1 and the second control signal CT2 are determined by the first power supply voltage VDD, the second power supply voltage VSS, the first switch SW1, the second switch SW2, and the fourth resistors R14 and R24. When the first power supply voltage VDD and the second power supply voltage VSS are more than respective threshold voltage levels VC1 and VC2, the PNP-type bipolar transistor PNP11 and the NPN-type bipolar transistor NPN21 saturate. The first control signal CT1 and the second control signal CT2 are logic "0s". When the first control signal CT1 and the second control signal CT2 correspond to currents, the first switch SW1 and the second switch SW2 do not receive or output the currents and so are turned off.

The first resistor R11 and the second resistor R12 are intended to control the threshold voltage level VC1. When a voltage at the resistor R11 is equal to the sum of a breakdown voltage of the zener diode D11 and a forward voltage (~0.7V) between base and emitter of the PNP-type bipolar transistor PNP11, on/off states of the PNP-type bipolar transistor PNP11 are inverted, thus inverting the first control signal CT1. The third resistor R13 is provided for convenience of designing, such as for increasing the threshold voltage level VC1 or decreasing the current at the base of the PNP-type bipolar transistor PNP11, and is not an essential element for the operation of the switch controller 241a.

The first resistor R21 and the second resistor R22 are also intended to control the threshold voltage level VC2, and functions of the third resistor R23 and the zener diode D21 are similar with those of the first resistor R13 and the zener diode D11, respectively.

Figure 8:
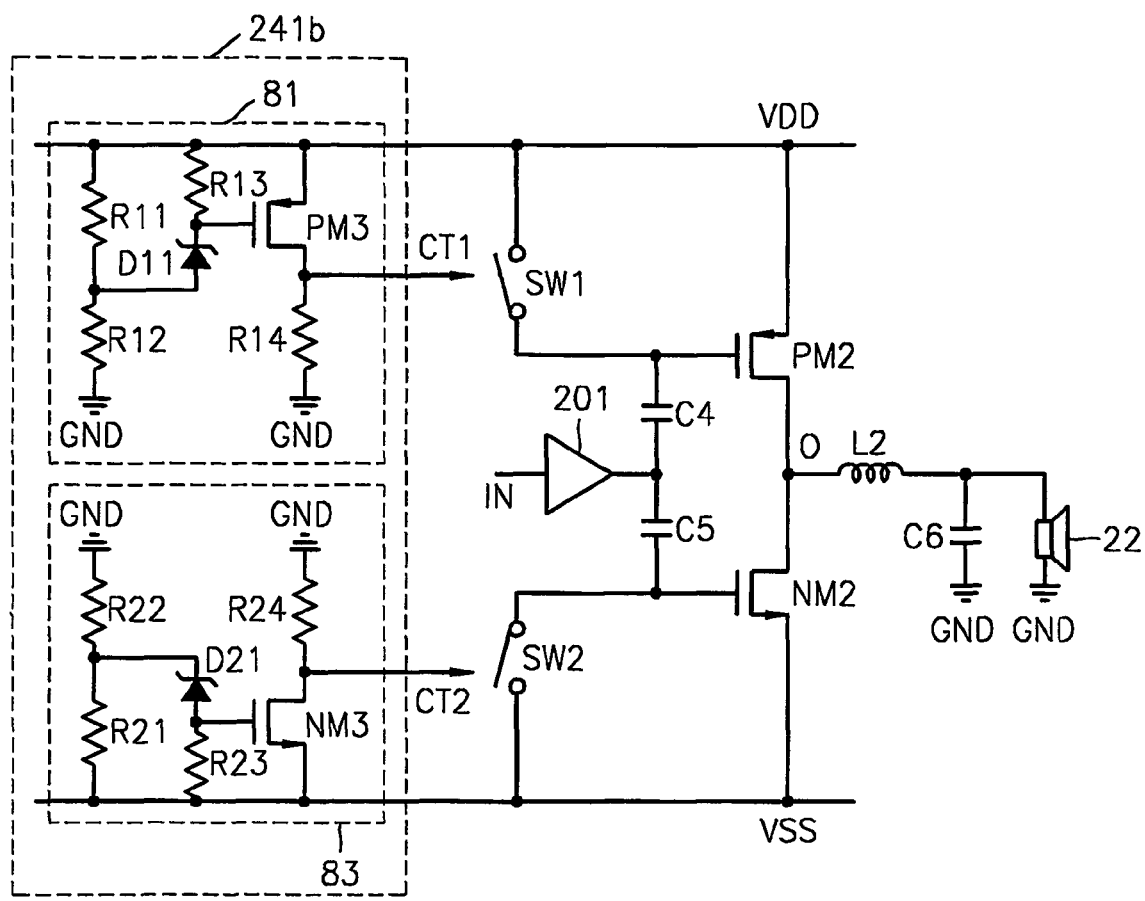
FIG. 8 illustrates the switch controller of FIG. 2 according to a second embodiment of the present invention.

FIG. 8 illustrates the switch controller 241 of FIG. 2 according to a second embodiment of the present invention. In FIG. 8, the PNP-type bipolar transistor PNP11 and the NPN-type bipolar transistor NPN21 of FIG. 7 are replaced by MOS transistors PM3 and NM3, respectively. The operation of the circuit according to the third embodiment of FIG. 8 is similar with that of the circuit according to the second embodiment of FIG. 7, but resistors R13 and R23 are necessarily required for the operation of the third embodiment.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

As described above, a circuit for and a method of eliminating pop noise according to the present invention directly control a power switch, i.e., a gate of a power MOS transistor in a digital audio amplifier using dual power supply, when power supply voltages are applied and the application of the power supply voltages is stopped, thereby suppressing generation of pop noise. Also, the present invention can be readily implemented using the small number of discrete electronic devices. Accordingly, drop in volume and price can be realized. Moreover, the circuit for eliminating pop noise can be easily integrated into a semiconductor chip, thus improving effects of the present invention much more.

What is claimed is:

1. A circuit for eliminating pop noise including a power PMOS transistor having a source to which a first power supply voltage is applied and a drain connected to an output terminal, a power NMOS transistor having a drain connected to the output terminal and a source to which a second power supply voltage is applied, a gate controller that controls a gate of the power PMOS transistor and a gate of the power NMOS transistor, and an output-terminal filter having an inductor and a capacitor, the circuit comprising:

a first switch, which is connected between the first power supply voltage and the gate of the power PMOS transistor;

a second switch, which is connected between the second power supply voltage and the gate of the power NMOS transistor; and a switch controller, which directly senses the first power supply voltage and the second power supply voltage and generates a first control signal for controlling the first switch and a second control signal for controlling the second switch, wherein the switch controller turns on the first switch and the second switch until the first power supply voltage and the second power supply voltage reach respective threshold voltages and turns off the first switch and the second switch after the first power supply voltage and the second power supply voltage reach respective threshold voltages.

2. The circuit of claim 1, wherein the first switch comprises:
   a PNP-type bipolar transistor, which has an emitter to which the first power supply voltage is applied and a base to which the first control signal is applied; and
   a diode, which has one terminal connected to a collector of the PNP-type bipolar transistor and the other terminal connected to the gate of the power PMOS transistor.

3. The circuit of claim 1, wherein the second switch comprises:
   an NPN-type bipolar transistor, which has an emitter to which the second power supply voltage is applied and a base to which the second control signal is applied; and
   a diode, which has one terminal connected to a collector of the NPN-type bipolar transistor and the other terminal connected to the gate of the power NMOS transistor.

4. The circuit of claim 1, wherein the first switch comprises a PMOS transistor having a source to which the first power supply voltage is applied, a gate to which the first control signal is applied, and a drain connected to the gate of the power PMOS transistor.

5. The circuit of claim 1, wherein the second switch comprises an NMOS transistor having a source to which the second power supply voltage is applied, a gate to which the second control signal is applied, and a drain connected to the gate of the power NMOS transistor.

6. The circuti of claim 1, wherein the swich controller comproses:

a first control portion, which senses the first power supply voltage and generates the first control signal; and a second control portion, which senses the second power supply voltage and generates the second control signal.

7. The circuit of claim 6, wherein the first control portion comprises:
   a first resistor, which has a terminal connected to the first power supply voltage;
   a second resistor, which has one terminal connected to the other terminal of the first resistor and the other terminal connected to a ground voltage;
   a third resistor, which has a terminal connected to the first power supply voltage;
   a diode, which has one terminal connected to the other terminal of the first resistor and the other terminal connected to the other terminal of the third resistor; and
   a PNP-type bipolar transistor, which has an emitter to which the first power supply voltage is applied, a base connected to the other terminal of the third resistor, and a collector that outputs the first control signal; and
   a fourth resistor, which has one terminal connected to the collector of the PNP-type bipolar transistor and the other terminal connected to the ground voltage.

8. The circuit of claim 6, wherein the second control portion comprises:
   a first resistor, which has a terminal connected to the second power supply voltage;
   a second resistor, which has one terminal connected to the other terminal of the first resistor and the other terminal connected to the ground voltage;
   a third resistor, which has a terminal connected to the second power supply voltage;
   a diode, which has one terminal connected to the other terminal of the first resistor and the other terminal connected to the other terminal of the third resistor; and
   a NPN-type bipolar transistor, which has an emitter to which the second power supply voltage is applied, a base connected to the other terminal of the third resistor, and a collector that outputs the second control signal;
   and a fourth resistor, which has one terminal connected to the collector of the NPN-type bipolar transistor and the other terminal connected to the ground voltage.

* * * * *